United States Patent
Hsiao et al.

(10) Patent No.: US 10,062,603 B2
(45) Date of Patent: Aug. 28, 2018

(54) AIR-GAP SCHEME FOR BEOL PROCESS

(71) Applicant: Taiwan Semiconductor Manufacturing Co., Ltd., Hsin-Chu (TW)

(72) Inventors: Ru-Shang Hsiao, Jhubei (TW); Chih-Fu Chang, Neipu Township (TW); Jen-Pan Wang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 94 days.

(21) Appl. No.: 15/223,483

(22) Filed: Jul. 29, 2016

(65) Prior Publication Data
US 2016/0336216 A1 Nov. 17, 2016

Related U.S. Application Data

(62) Division of application No. 14/205,878, filed on Mar. 12, 2014, now Pat. No. 9,449,811.

(51) Int. Cl.
*H01L 21/4763* (2006.01)
*H01L 21/768* (2006.01)
(Continued)

(52) U.S. Cl.
CPC .... *H01L 21/7682* (2013.01); *H01L 21/02271* (2013.01); *H01L 21/7681* (2013.01);
(Continued)

(58) Field of Classification Search
None
See application file for complete search history.

(56) References Cited

U.S. PATENT DOCUMENTS 5,324,683 A * 6/1994 Fitch .................... G01P 15/0802
148/DIG. 73
7,009,272 B2 * 3/2006 Borger ................ H01L 21/0214
257/522

(Continued)

FOREIGN PATENT DOCUMENTS

CN 103117245 A 5/2013

OTHER PUBLICATIONS

Non-Final Office Action dated Aug. 27, 2015 for U.S. Appl. No. 14/205,878.
(Continued)

*Primary Examiner* — Ali Naraghi
(74) *Attorney, Agent, or Firm* — Eschweiler & Potashnik, LLC

(57) ABSTRACT

The present disclosure relates a back-end-of-the-line (BEOL) metallization stack having an air gap disposed between adjacent metal interconnect features, which provides for an inter-level dielectric material with a low dielectric constant. In some embodiments, the BEOL metallization stack has an inter-level dielectric (ILD) layer disposed over a substrate. A metal interconnect layer is disposed within the ILD layer, and an air gap is arranged disposed within the ILD layer at a position between a first feature and a second feature of the metal interconnect layer. The air gap has an upper surface with a first curve that meets a second curve at a peak arranged below a top of the metal interconnect layer. The first curve becomes steeper as a distance from the peak decreases and the second curve becomes steeper as a distance from the peak decreases.

20 Claims, 5 Drawing Sheets

(51) Int. Cl.
*H01L 21/02* (2006.01)
*H01L 23/522* (2006.01)
*H01L 23/528* (2006.01)
H01L 23/532 (2006.01)

(52) U.S. Cl.
CPC .... *H01L 21/7685* (2013.01); *H01L 21/76822* (2013.01); *H01L 21/76834* (2013.01); *H01L 21/76877* (2013.01); *H01L 23/5222* (2013.01); *H01L 23/5226* (2013.01); *H01L 23/5283* (2013.01); *H01L 23/53295* (2013.01); *H01L 23/53238* (2013.01); *H01L 2924/0002* (2013.01)

(56) References Cited

U.S. PATENT DOCUMENTS

| | | | |
|---|---|---|---|
| 7,994,046 B2* | 8/2011 | Jeng | H01L 21/76814 257/758 |
| 2007/0178713 A1 | 8/2007 | Jeng | |
| 2010/0093168 A1* | 4/2010 | Naik | H01L 21/31144 438/618 |

OTHER PUBLICATIONS

Final Office Action dated Mar. 24, 2016 for U.S. Appl. No. 14/205,878.
Notice of Allowance dated May 13, 2016 for U.S. Appl. No. 14/205,878.

* cited by examiner

AIR-GAP SCHEME FOR BEOL PROCESS

REFERENCE TO RELATED APPLICATION

This Application is a Divisional of U.S. application Ser. No. 14/205,878 filed on Mar. 12, 2014, the contents of which is hereby incorporated by reference in its entirety.

BACKGROUND

Integrated chips comprise semiconductor devices that are disposed within a semiconductor substrate, and which are interconnected together by way of a plurality of back-end-of-the-line (BEOL) metal interconnect layers formed over the semiconductor substrate. The metal interconnect layers are conductive wires and vias that connect the semiconductor devices to one another and to the outside world (e.g., to pins of an integrated chip package). The metal interconnect layers are disposed within a dielectric material that is formed over the semiconductor substrate. The dielectric material has a low dielectric constant (k) that provides for structural support of a metal interconnect layer without allowing for electrical shorting between different features of the metal interconnect layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
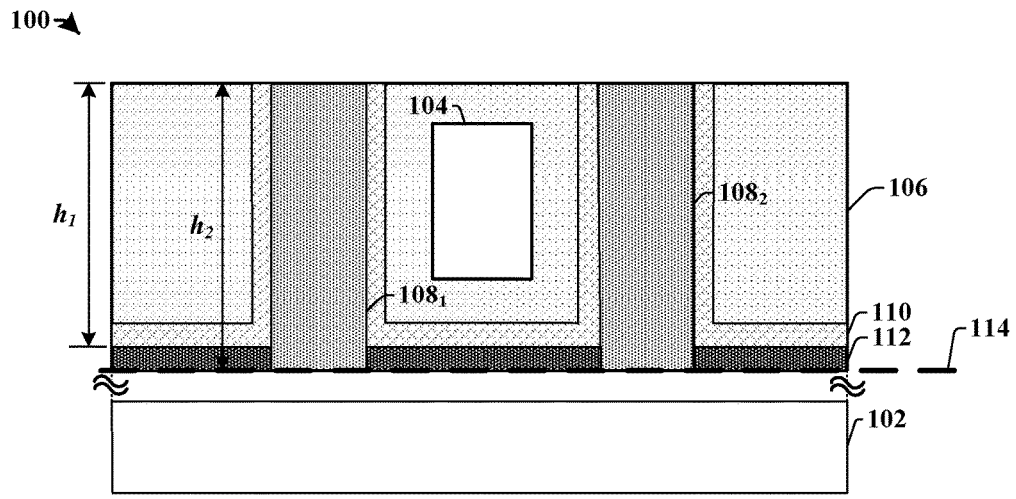
FIG. 1 illustrates some embodiments of a back-end-of-the-line (BEOL) metallization layer comprising an air gap disposed within a dielectric material.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the dimensions of integrated chip elements continue to scale, the spacing between back-end-of the line (BEOL) metal interconnect features is continually reduced. As the distance between metal interconnect features decreases, the resulting parasitic capacitance between the metal interconnect features increases, which leads to higher power consumption and larger RC time delays for an integrated chip. To improve performance and reduce parasitic capacitance between BEOL metal interconnect features, integrated chip manufacturers use inter-level dielectric (ILD) layers comprising materials having low dielectric (k) values.

For example, in many recent technology nodes, thin metallization layers use low-k or ultra low-k dielectric materials having dielectric constants (k) of between 2 and 3. However, such dielectric materials run into a number of processing problems that prevent further improvement of the dielectric constant. For example, porous materials that are provide low dielectric constants often comprise porous films that are prone to peeling and which result in package stress failure.

The present disclosure relates to a method of forming a back-end-of-the-line (BEOL) metallization layer having an air gap disposed between adjacent metal interconnect features, which provides for an inter-level dielectric material with a low dielectric constant, and an associated apparatus. In some embodiments, the method comprises forming a metal interconnect layer within a sacrificial dielectric layer overlying a semiconductor substrate. The sacrificial dielectric layer is removed to form a recess extending between first and second features of the metal interconnect layer. A protective liner is formed onto the sidewalls and bottom surface of the recess, and then a re-distributed ILD layer is deposited within the recess in a manner that forms an air gap at a position between the first and second features of the metal interconnect layer. The air gap reduces the dielectric constant between the first and second features of the metal interconnect layer, thereby improving power consumption and RC time delays for the BEOL metallization layer.

FIG. 1 illustrates some embodiments of a back-end-of-the-line (BEOL) metallization layer 100 comprising an air gap disposed within a dielectric material.

The BEOL metallization layer 100 comprises an inter-level dielectric (ILD) layer 106 (e.g., a low-k dielectric material) located over a substrate 102. A metal interconnect layer 108 is disposed within the ILD layer 106. The metal interconnect layer 108 comprises a first metal interconnect feature $108_1$ and a second metal interconnect feature $108_2$, which are separated by the ILD layer 106.

An air gap 104 is disposed within the ILD layer 106 at a position laterally disposed between the first metal interconnect feature $108_1$ and the second metal interconnect feature $108_2$ of the metal interconnect layer 108. The air gap 210 is configured to provide the ILD layer 106 with an extremely low dielectric constant (e.g., k~1). The low dielectric constant reduces the capacitance between the first and second metal interconnect features, $108_1$ and $108_2$. The reduced capacitance improves performance of an integrated chip by reducing an RC time delay of back-end-of-the-line (BEOL) metallization layer 100.

A protective liner layer 110 separates the ILD layer 106 from the first and second metal interconnect features, $108_1$ and $108_2$. The protective liner layer 110 vertically extends from a position above a bottom surface of the metal interconnect layer 108 to a position that is vertically aligned with a top surface of the metal interconnect layer 108. The offset between the bottom surface of the protective liner layer 110 and the metal interconnect layer 108 causes the protective liner layer 110 to have a first height $h_1$ that is less than a second height $h_2$ of the metal interconnect layer 108.

In some embodiments, the protective liner layer 110 is located on and in direct contact with an etch stop layer 112, which is laterally disposed between the first and second metal interconnect features, $108_1$ and $108_2$. In some embodiments, a bottom surface of the etch stop layer 112 is vertically aligned with a bottom surface of the metal interconnect layer 108 along a horizontal line 114. In some embodiments, the protective liner layer 110 may be further disposed onto the sidewalls of the first and second features, $108_1$ and $108_2$, so that the protective liner layer 110 makes a 'U' shape between the first and second metal interconnect features, $108_1$ and $108_2$.

In various embodiments, the protective liner layer 110 may comprise an oxide, a nitride, and/or a silicon layer. For example, in some embodiments, the protective liner layer 110 may comprise an oxide layer, a nitride layer or a carbon nitride layer. In other embodiments, the protective liner layer 110 may a silicon layer, a silicon rich oxide layer, a silicon rich nitride layer or a silicon carbon nitride layer. In various embodiments, the etch stop layer 112 may comprise titanium nitride (TiN) or tantalum nitride (TaN), for example.

Figure 2:
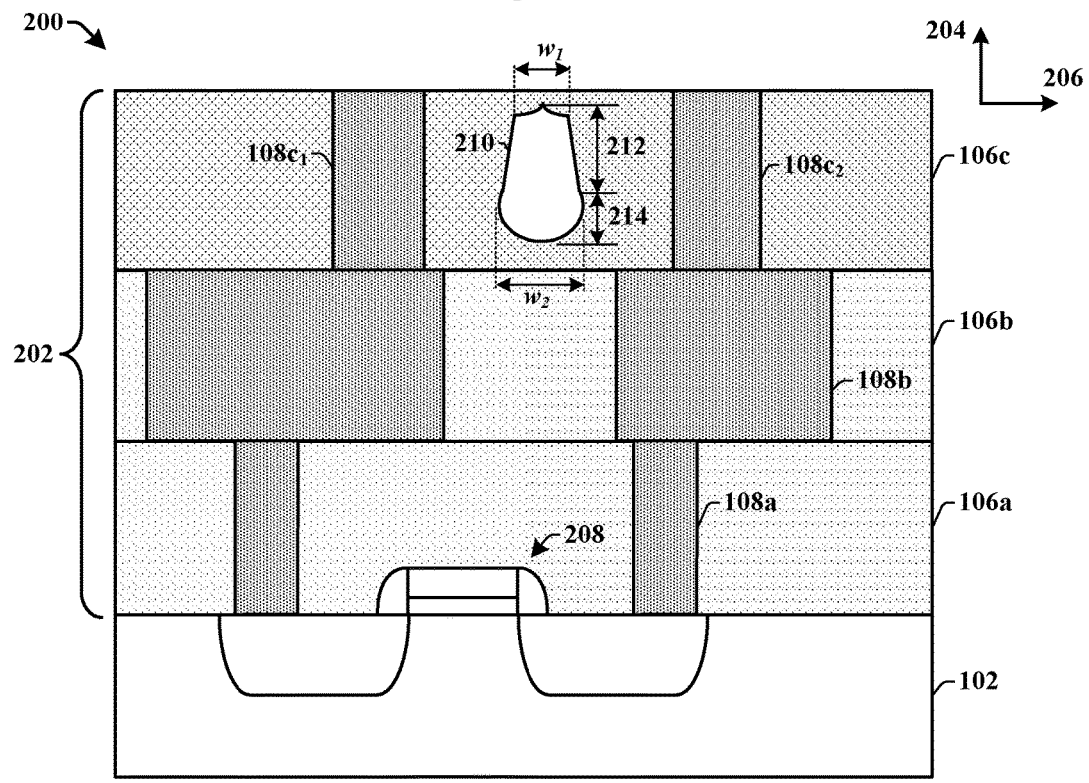
FIG. 2 illustrates some embodiments of a BEOL metal interconnect stack comprising a hammerhead air gap disposed within an inter-level dielectric (ILD) layer.

FIG. 2 illustrates some embodiments of an integrated chip 200 having a back-end-of-the-line (BEOL) metal interconnect stack 202 comprising a hammerhead air gap disposed within an inter-level dielectric (ILD) layer.

The BEOL metal interconnect stack 202 comprises a plurality of inter-level dielectric (ILD) layers 106a-106c disposed over a substrate 102. In various embodiments, the plurality of ILD layers 106a-106c may comprise one or more dielectric materials (e.g., low-k dielectric material, oxide material, etc.). For example, in some embodiments, the plurality of ILD layers 106a-106c may comprise a same dielectric material. In other embodiments, a first ILD layer 106a and a second ILD layer 106b may comprise a first dielectric material (e.g., a low-k dielectric material) while a third ILD layer 106c may comprise a second dielectric material (e.g., un-doped $SiO_2$, fluorosilicate glass, etc) different than the first dielectric material.

Metal interconnect layers 108a-108c are respectively disposed within the plurality of ILD layers 106a-106c. The metal interconnect layers 108a-108c comprise a conductive material (e.g., copper, aluminum, titanium, tungsten, etc.) that is configured to convey electrical signals. The metal interconnect layers 108a-108c alternate between metal via layers configured to provide for vertical connections along a first direction 204 and metal wire layers configured to provide for lateral connections along a second direction 206 perpendicular to the first direction. For example, a first metal interconnect layer 108a within the first ILD layer 106a may comprise a metal via layer (e.g., a contact layer making contact with an underlying transistor 208 device located in substrate 102), a second metal interconnect layer 108b within the second ILD layer 106b may comprise a metal wire layer electrically coupled to the underlying metal via layer, and a third metal interconnect layer 108c within the third ILD layer 106c may comprise a metal via layer electrically coupled to the underlying metal wire layer.

Air gaps 210 are disposed within one or more of the ILD layers 106a-106c at positions laterally disposed between a first metal interconnect feature and a second metal interconnect feature of an associated metal interconnect layer 108. For example, an air gap 210 is disposed within the third ILD layer 106c at a position laterally disposed between a first metal interconnect feature $108c_1$ and a second metal interconnect feature $108c_2$ of the third metal interconnect layer 108c.

The air gaps 210 comprise a hammerhead shape having an upper section 212 and a lower section 214. The upper section 212 has a smaller average width than that of a lower section 214. For example, air gap 210 has an upper section 212 that has an average width of $w_1$ and a lower section 214 that has an average width of $w_2$ that is larger than $w_1$. In some embodiments, the upper section 212 of the hammerhead shape is separated from the lower section 214 at a point at which the slope of the sidewalls of hammerhead shape changes. In some embodiments, the upper section 212 may have a greater height than that of the lower section 214.

Figure 3:
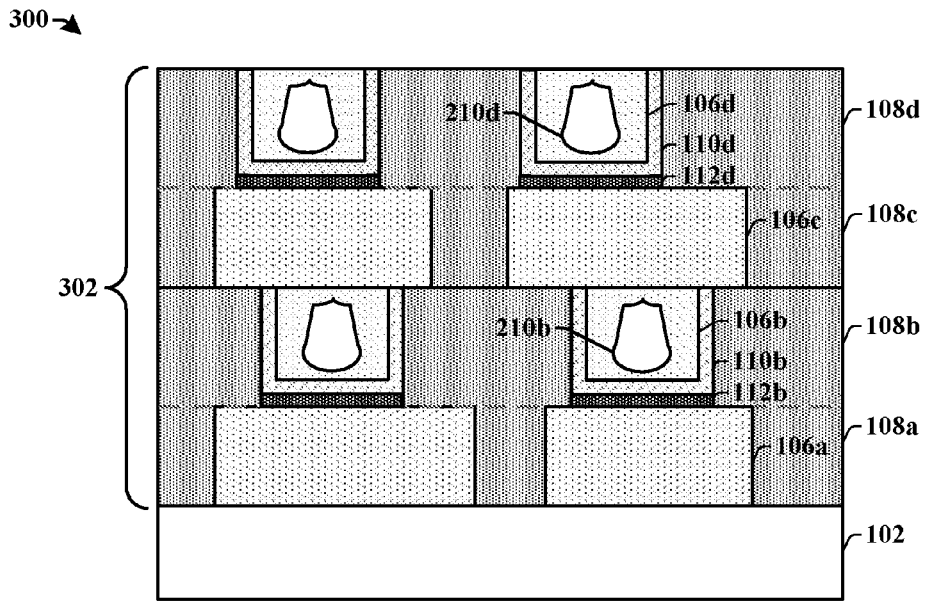
FIG. 3 illustrates some alternative embodiments of a BEOL metal interconnect stack comprising a hammerhead air gap disposed within an inter-level dielectric (ILD) layer.

FIG. 3 illustrates some alternative embodiments of a BEOL metal interconnect stack 302 comprising a hammerhead air gap disposed within an inter-level dielectric (ILD) layer.

The BEOL metal interconnect stack 302 comprises metal interconnect layers 108a-108d respectively disposed within a plurality of stacked ILD layers 106a-106d. In some embodiments, the air gaps 210 may be located in either metal via layers (e.g., 108a and 108c) or metal wire layers (e.g., 108b and 108d). For example, in BEOL metal interconnect stack 302, an air gap 210b is located within a second ILD layer 106b at a position that is laterally between first and second metal interconnect features of a metal interconnect layer 108b comprising a metal wire. An additional air gap 210d is located within a fourth ILD layer 106d at a position that is laterally between first and second additional metal interconnect features of a metal interconnect layer 108d comprising a metal wire.

Although, BEOL metal interconnect stack 302 illustrates air gaps 210 within the second and fourth ILD layers, 106b and 106d, it will be appreciated that such a configuration is a non-limiting example and that in other embodiments any of the other ILD layers may comprise air gaps. For example, in some embodiments the first and third ILD layers, 106a and 106c, may comprise air gaps, while in other embodiments, ILD layers 106a through 106d may comprise air gaps 210.

Figure 4:
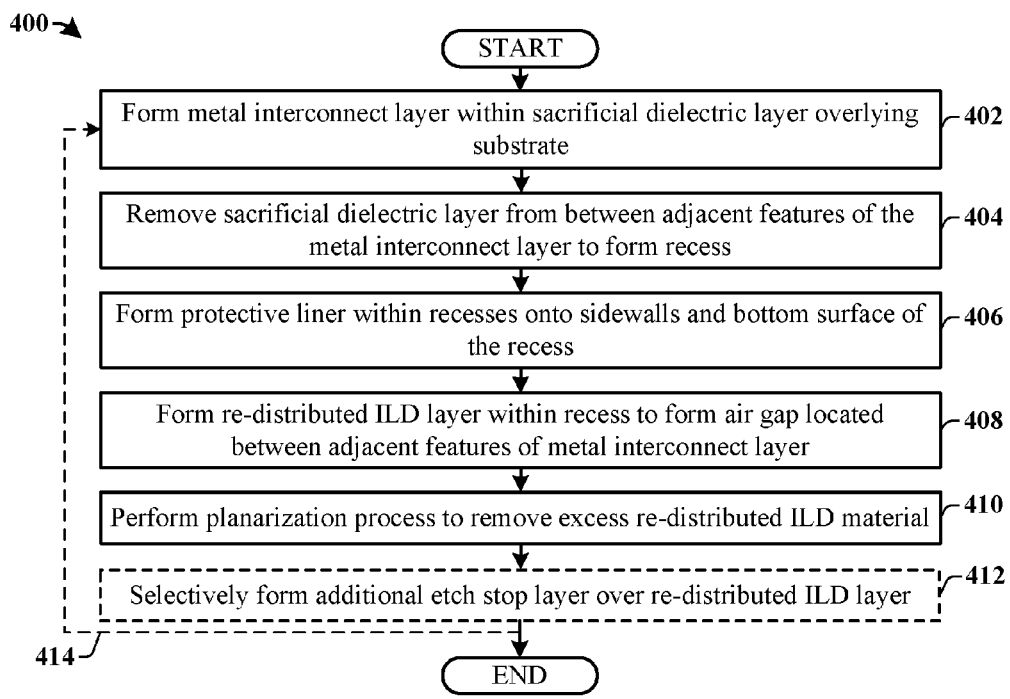
FIG. 4 illustrates a flow diagram of some embodiments of a method of forming a back-end-of-the-line metallization layer comprising an air gap disposed within a dielectric material.

FIG. 4 illustrates a flow diagram of some embodiments of a method 400 of forming a back-end-of-the-line (BEOL) metallization layer comprising an air gap disposed within a dielectric material.

While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a metal interconnect layer is formed within a sacrificial dielectric layer overlying a substrate. In some embodiments, the sacrificial dielectric layer is disposed over an etch stop layer. In such embodiments, the metal interconnect layer extends from a top surface of the sacrificial dielectric layer to positions along a bottom surface of the sacrificial dielectric layer that are laterally located between the etch stop layer.

At 404, the sacrificial dielectric layer is removed from between adjacent features of the metal interconnect layer (i.e., adjacent metal interconnect features) to form a recess between the adjacent metal interconnect features. In some embodiments, the recess extends from the etch stop layer to a top of the metal interconnect layer.

At 406, a protective liner layer is formed onto the sidewalls and bottom surface of the recess (i.e., onto sidewalls of the metal interconnect layer). The protective liner layer is configured to provide structural support to the metal interconnect layers. The structural support prevents the adjacent metal interconnect features, which may have a weak structural integrity due to their small size, from collapsing during subsequent processing.

At 408, a re-distribution ILD layer is formed within the recess in a manner that forms an air gap located between the adjacent metal interconnect features. In some embodiments, the air gap may comprise a hammerhead shape having an upper portion with a first width and a lower portion with a second width that is greater than the first width.

At 410, a planarization process (e.g., a chemical mechanical polishing process) is performed to remove excess material of the re-distribution ILD layer that is vertically above the metal interconnect layer.

At 412, an additional etch stop layer may be selectively formed over the re-distribution ILD layer at positions in which an overlying ILD layer will be deposited. For example, in some embodiments, the additional etch stop layer may be selectively formed at positions that to not overlie the metal interconnect layer.

It will be appreciated that method 400 may be iteratively performed (as shown by line 414) during formation of a back-end-of-the-line metallization stack comprising a plurality of metallization layers. For example, the method may be performed a first time to form a first thin metal layer (i.e., a metal 1 layer), a second time to form a second thin metal layer comprising a via/contact layer (i.e., a via 1 layer) vertically coupled to the first thin metal layer, and third time to form a second thin metal wire layer vertically coupled to the first via layer, etc.

FIGS. 5-10 illustrate some embodiments of cross-sectional views of a semiconductor substrate showing a method of forming a back-end-of-the-line (BEOL) metallization layer comprising a hammerhead air gap disposed within an inter-level dielectric (ILD) material. Although FIGS. 5-10 are described in relation to method 400, it will be appreciated that the structures disclosed in FIGS. 5-10 are not limited to such a method.

Figure 5:
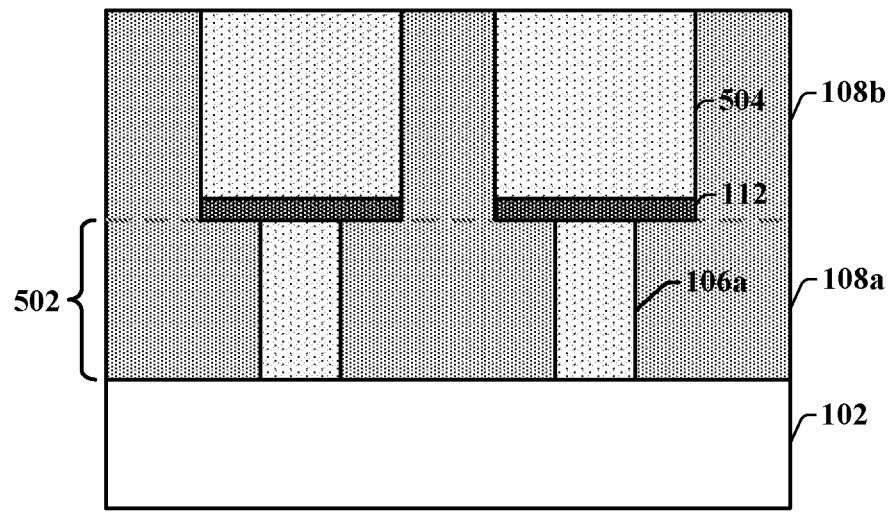
FIGS. 5-10 illustrate some embodiments of cross-sectional views of a semiconductor substrate showing a method of forming a back-end-of-the-line metallization layer comprising a hammerhead air gap disposed within an inter-level dielectric (ILD) material.

FIG. 5 illustrates a cross-sectional view 500 of some embodiments of a semiconductor substrate corresponding to act 402.

As shown in cross-sectional view 500, a metal interconnect layer 108b is formed within a sacrificial dielectric layer 504 overlying a substrate 102 at a position that is laterally disposed between an etch stop layer 112. In some embodiments, the substrate 102 may comprise a semiconductor substrate, comprising any type of semiconductor body (e.g., silicon, silicon-germanium, silicon-on-insulator) as well as any other type of semiconductor and/or epitaxial layers associated therewith. In some embodiments, the metal interconnect layer 108b may be vertically coupled to an underlying metal interconnect layer 108a disposed within a BEOL metallization layer 502 positioned between the metal interconnect layer 108b and the substrate 102.

In some embodiments, the metal interconnect layer 108b may be formed using a single damascene process in which a single metal layer is formed at a time. For example, the second metal interconnect layer 108b may be formed by selectively etching the sacrificial dielectric layer 504 to form cavities within the sacrificial dielectric layer 504 that are laterally located between the etch stop layer 112. After the cavities are formed, an electro chemical platting process is then used to fill the cavities with metal a diffusion barrier layer (not shown) and a seed layer may be deposited within the cavities. (e.g., copper). In other embodiments, the metal interconnect layer 108b may be formed using a dual damascene process, in which metal interconnect layer, 108a and 108b, are formed at using a single metal formation step (e.g., a single electroplating step).

Figure 6:
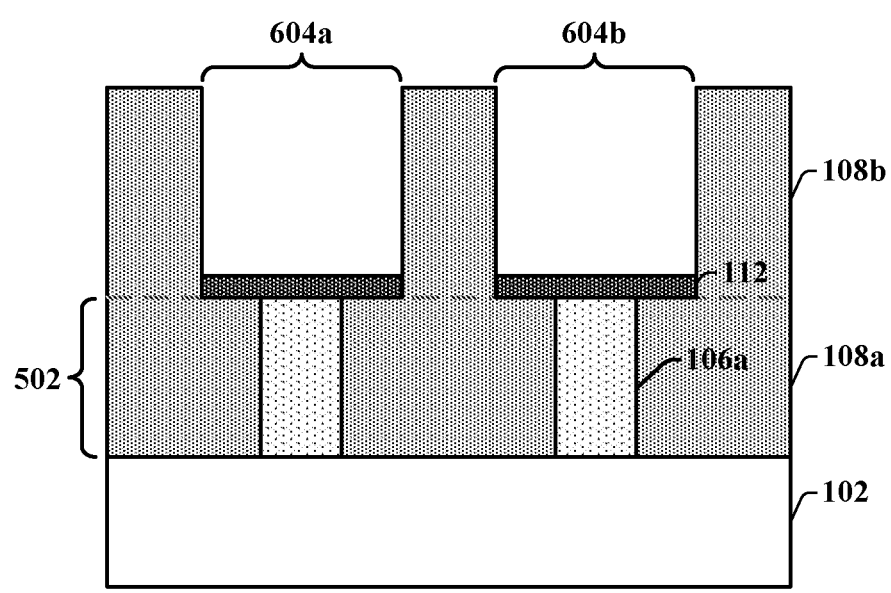

FIG. 6 illustrates a cross-sectional view 600 of some embodiments of a semiconductor substrate corresponding to act 404.

Figure 7:
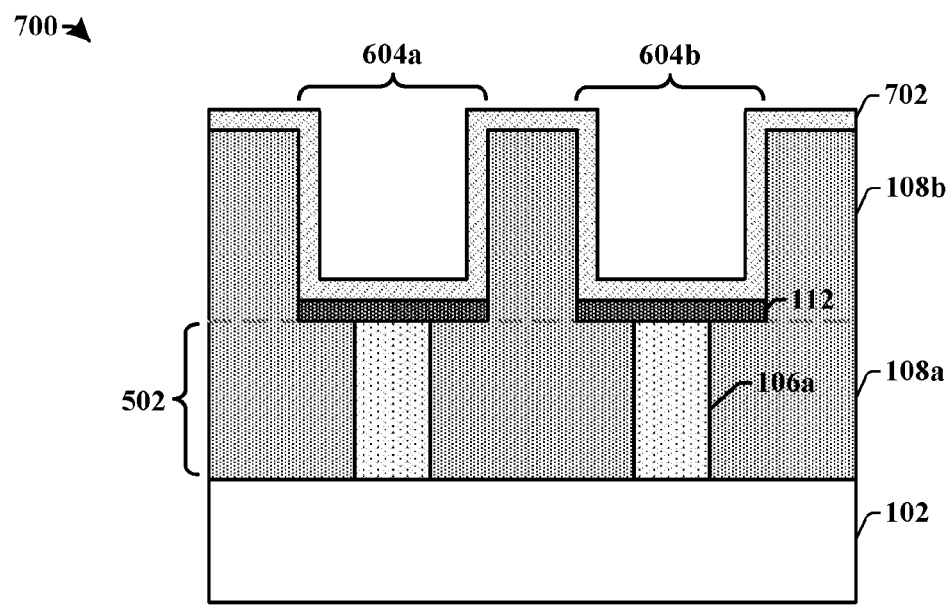

As shown in cross-sectional view 600, the sacrificial dielectric layer 504 is removed from between metal interconnect features of the second metal interconnect layer 108b. In some embodiments, the sacrificial dielectric layer 504 may be removed by selectively exposing the sacrificial dielectric layer 504 to an etchant 602. The etchant 602 removes the sacrificial dielectric layer 504 to form recesses, 604a and 604b, between metal interconnect features of the second metal interconnect layer 108b. The recesses, 604a and 604b, vertically extend from the etch stop layer 112 to a top surface of the second metal interconnect layer 108b. In some embodiments, etchant 602 may comprise a dry etchant. For example, the etchant 602 may comprise a dry etchant that uses an etching chemistry comprising oxygen, nitrogen, fluoroform, and/or tetrafluoromethane FIG. 7 illustrates a cross-sectional view 700 of some embodiments of a semiconductor substrate corresponding to act 406.

As shown in cross-sectional view 700, a protective liner layer 702 is formed over the metal interconnect layer 108b and the etch stop layer 112. The protective liner layer 702 is configured to provide structural support to metal interconnect features of the second metal interconnect layer 108b. The structural support prevents the metal interconnect features of the second metal interconnect layer 108b, which may have a weak structural integrity due to their small size (e.g., having a width of less than 50 nm), from collapsing during subsequent processing.

In some embodiments, the protective liner layer 702 continuously extends between metal interconnect features of the second metal interconnect layer 108b along a bottom surface and sidewalls of the recesses, 604a and 604b. The protective liner layer 702 vertically extends from a position above a bottom surface of the second metal interconnect layer 108b to a position that is vertically aligned with a top surface of the second metal interconnect layer 108b.

In some embodiments, the protective liner layer 702 may be deposited as a conformal film using a vapor deposition process (e.g., atomic layer deposition, physical vapor deposition, chemical vapor deposition, etc.). In various embodiments, the protective liner layer 702 may comprise an oxide, a nitride, and/or a silicon layer. For example, in some embodiments, the protective liner layer 702 may comprise an oxide layer, a nitride layer or a carbon nitride layer. In other embodiments, the protective liner layer 702 may a silicon layer, a silicon rich oxide layer, a silicon rich nitride layer or a silicon carbon nitride layer.

Figure 8:
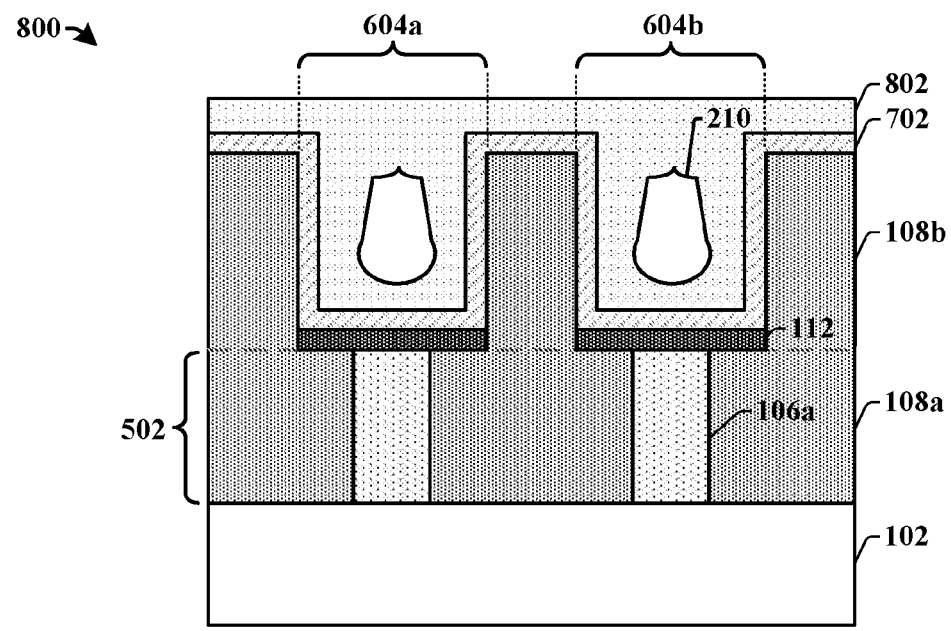

FIG. 8 illustrates a cross-sectional view 800 of some embodiments of a semiconductor substrate corresponding to act 408.

As shown in cross-sectional view 800, a re-distributed ILD layer 802 is formed within the recesses, 604a and 604b. The re-distributed ILD layer 802 is formed in a manner that provides for an air gap 210 disposed between adjacent features of the metal interconnect layer 108b. The re-distributed ILD layer 802 is located at a position that is separated from the metal interconnect layer 108b by way of the protective liner layer 702. In some embodiments, the re-distributed ILD layer 802 may comprise a dielectric material, such as an un-doped silicate glass (USG) thin film or a fluorosilicate glass (FSG) thin film.

In some embodiments, the air gap 210 may be formed to have a hammerhead shape. In some embodiments, an air gap 210 having a hammerhead shape may be formed by a chemical vapor deposition (CVD) process (e.g., low-pressure CVD, plasma enhanced CVD, etc.) The deposition characteristics of the CVD process allow for the re-distributed ILD layer 802 (e.g., a USG thin film, FSG thin film) to be deposited in a manner that forms an air gap 210 having a hammerhead shape due to the relatively small spacing (e.g., less than 50 nm) between metal interconnect features. For example, due to the large aspect ratio (i.e., the relatively large height compared to the width) of the recesses, 604a and 604b, in advanced processing nodes (e.g., below 14 nm node), the CVD process forms the re-distributed ILD layer 802 more easily at the bottom and the top than on the sidewalls of the recesses, 604a and 604b, resulting in an air gap 210 having the hammerhead shape (i.e., profile). This is because the CVD process will deposit the re-distributed ILD layer 802 on the bottom of the recesses, 604a and 604b, more easily than on the sidewalls of the recesses, 604a and 604b, resulting in the curved bottom of the hammerhead shape. Similarly, the CVD process will deposit the re-distributed ILD layer 802 at the top of the recesses, 604a and 604b, to form the top of the hammerhead shape. It will be appreciated that depending on the size and aspect ratio of the recesses, 604a and 604b, one or more characteristics (e.g., deposition rate) of the CVD process may be varied to achieve air gaps 210 having a hammerhead structure.

Figure 9:
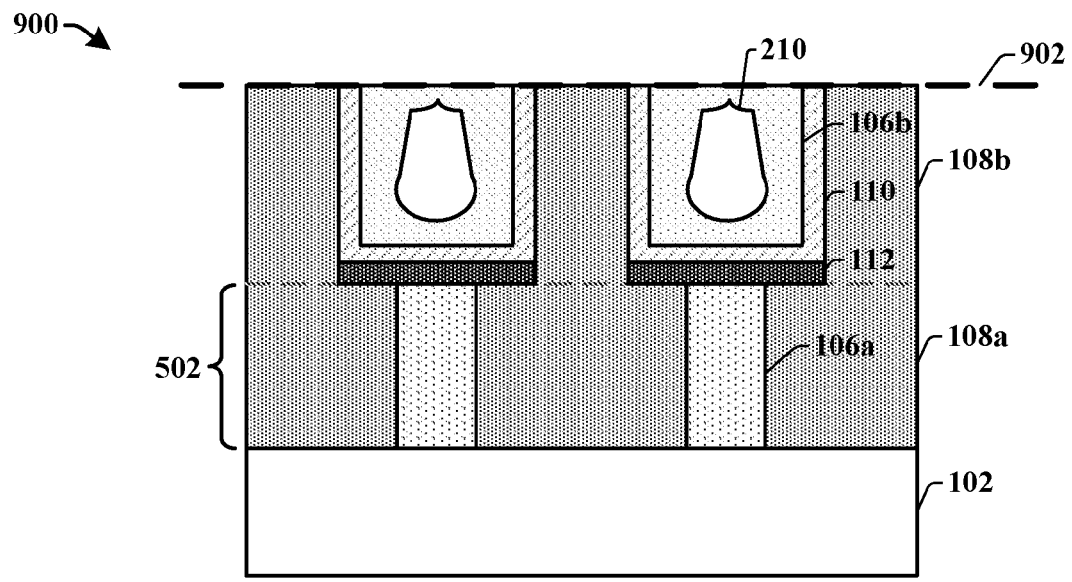

FIG. 9 illustrates a cross-sectional view 900 of some embodiments of a semiconductor substrate corresponding to act 310.

As shown in cross-sectional view 900, a planarization process is performed. The planarization process planarizes the top surface of the substrate along line 902. As the substrate is planarized, excess dielectric material from the re-distributed ILD layer 802 is removed from above the second metal interconnect layer 108b so as to form a substantially flat surface extending along a top of the second metal interconnect layer 108b. In some embodiments, the planarization process may comprise a chemical mechanical polishing (CMP) process.

Figure 10:
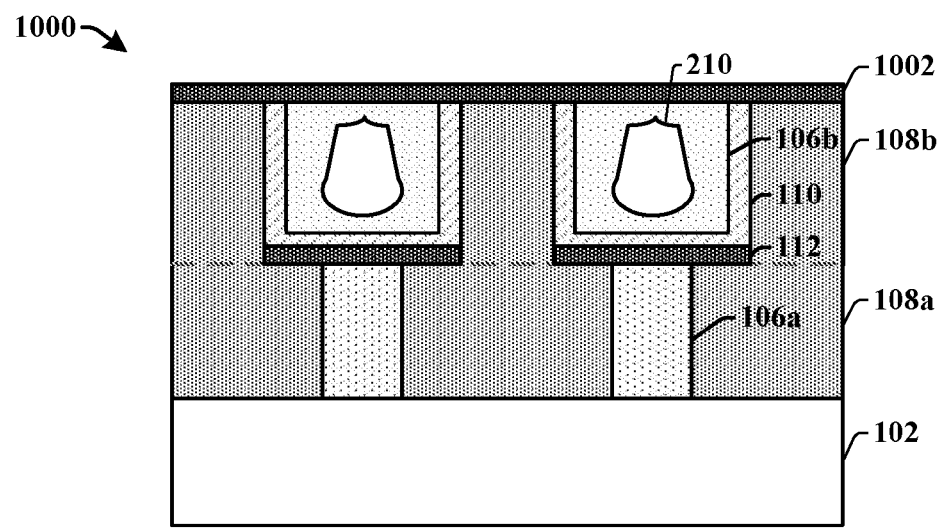

FIG. 10 illustrates a cross-sectional view 1000 of some embodiments of a semiconductor substrate corresponding to act 312.

As shown in cross-sectional view 1000, an additional etch stop layer 1002 may be formed over the ILD layer 106b. In some embodiments, the additional etch stop layer 1002 may be patterned so that it is formed at positions corresponding to an overlying layer of ILD material.

Therefore, the present disclosure relates to a method of forming a back-end-of-the-line (BEOL) metallization layer having an air gap disposed between adjacent metal interconnect features, which provides for an inter-level dielectric material with a low dielectric constant, and an associated apparatus.

In some embodiments, the present disclosure relates to a back-end-of-the-line (BEOL) metal interconnect stack. The BEOL metal interconnect stack comprises an inter-level dielectric (ILD) layer disposed over a substrate. A metal interconnect layer is disposed within the ILD layer, and an air gap is disposed within the ILD layer at a position between a first feature and a second feature of the metal interconnect layer. The air gap comprises an upper surface having a first curve that meets a second curve at a peak arranged below a top of the metal interconnect layer. The first curve becomes steeper as a distance from the peak decreases and wherein the second curve becomes steeper as a distance from the peak decreases.

In other embodiments, the present disclosure relates to a back-end-of-the-line (BEOL) metal interconnect stack. The BEOL metal interconnect stack comprises an inter-level dielectric (ILD) layer disposed over a semiconductor substrate, and a metal interconnect layer laterally surrounded by the ILD layer. An air gap is disposed within the ILD layer at a position between a first feature and a second feature of the metal interconnect layer. The air gap has an upper surface comprising a first curve and a second curve that intersect at a first cusp which is arranged below a top of the metal interconnect layer. The first curve has a second cusp located at a non-differentiable point along the first curve, and the first curve is concave to a plane that intersects the first cusp and the second cusp.

In yet other embodiments, the present disclosure relates to a back-end-of-the-line (BEOL) metal interconnect stack. The BEOL metal interconnect stack comprises a metal interconnect layer comprising first and second metal interconnect features arranged over a substrate. An etch stop layer is laterally arranged between the first and second metal interconnect features, and a protective liner layer is arranged on sidewalls of the first and second metal interconnect features and onto an upper surface of the etch stop layer. An inter-level dielectric (ILD) layer is arranged onto the protective liner layer and extends from an upper surface of the etch stop layer to a top surface of the metal interconnect layer. The ILD layer has an air gap arranged between the first and second metal interconnect features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back-end-of-the-line (BEOL) metal interconnect stack, comprising:

an inter-level dielectric (ILD) layer disposed over a substrate;

a metal interconnect layer disposed within the ILD layer; and an air gap disposed within the ILD layer at a position between a first feature and a second feature of the metal interconnect layer, wherein the air gap comprises an upper surface having a first curve that meets a second curve at a peak arranged below a top of the metal interconnect layer, wherein the first curve becomes steeper as a distance from the peak decreases and wherein the second curve becomes steeper as a distance from the peak decreases.

2. The BEOL metal interconnect stack of claim 1, further comprising:

an etch stop layer disposed under the ILD layer at a position that is laterally between the first feature and the second feature of the metal interconnect layer.

3. The BEOL metal interconnect stack of claim 1, further comprising:

a protective liner layer disposed between the metal interconnect layer and the ILD layer.

4. The BEOL metal interconnect stack of claim 3, wherein the protective liner layer comprises an oxide or a nitride.

5. The BEOL metal interconnect stack of claim 3, wherein the protective liner layer comprises silicon.

6. The BEOL metal interconnect stack of claim 3, wherein the protective liner layer comprises a 'U' shaped structure that continuously extends from along a first sidewall of the first feature of the metal interconnect layer to along a second sidewall of the second feature of the metal interconnect layer.

7. The BEOL metal interconnect stack of claim 3, wherein the protective liner layer has a top surface that is substantially co-planar with top surfaces of the first feature and the second feature of the metal interconnect layer.

8. The BEOL metal interconnect stack of claim 3, wherein the air gap has a curved bottom surface.

9. A back-end-of-the-line (BEOL) metal interconnect stack, comprising:

an inter-level dielectric (ILD) layer disposed over a semiconductor substrate;

a metal interconnect layer laterally surrounded by the ILD layer;

an air gap disposed within the ILD layer at a position between a first feature and a second feature of the metal interconnect layer, wherein the air gap has an upper surface comprising a first curve and a second curve that intersect at a first cusp which is arranged below a top of the metal interconnect layer; and wherein the first curve has a second cusp located at a non-differentiable point along the first curve, and wherein the first curve is concave to a plane that intersects the first cusp and the second cusp.

10. The BEOL metal interconnect stack of claim 9, wherein the first curve has a slope that decreases as a distance from the first cusp increases.

11. The BEOL metal interconnect stack of claim 9, further comprising:

an etch stop layer having outermost sidewalls that are laterally arranged between the first feature and the second feature of the metal interconnect layer.

12. The BEOL metal interconnect stack of claim 11, further comprising:

a protective liner layer arranged on sidewalls of the first feature and the second feature of the metal interconnect layer and onto an upper surface of the etch stop layer.

13. The BEOL metallization stack of claim 12, wherein the ILD layer and the protective liner layer have top surfaces that are substantially co-planar.

14. The BEOL metallization stack of claim 12, further comprising:

a second etch stop layer contacting upper surfaces of the ILD layer and the protective liner layer.

15. A back-end-of-the-line (BEOL) metallization layer, comprising:

a metal interconnect layer comprising first and second metal interconnect features arranged over a substrate;

an etch stop layer laterally arranged between the first and second metal interconnect features;

a protective liner layer arranged on sidewalls of the first and second metal interconnect features and onto an upper surface of the etch stop layer; and an inter-level dielectric (ILD) layer arranged onto the protective liner layer and extending from an upper surface of the protective liner layer to a top surface of the metal interconnect layer, wherein the ILD layer has an air gap arranged between the first and second metal interconnect features.

16. The BEOL metallization layer of claim 15, wherein the ILD layer and the protective liner layer have top surfaces that are substantially co-planar.

17. The BEOL metallization layer of claim 15, wherein the etch stop layer has first and second sidewalls that laterally contact the first and second metal interconnect features.

18. The BEOL metallization layer of claim 15, wherein the air gap has an upper surface that is below the top surface of the metal interconnect layer.

19. The BEOL metallization layer of claim 15, further comprising:

a second etch stop layer contacting upper surfaces of the ILD layer and the protective liner layer.

20. The BEOL metallization layer of claim 15, wherein the air gap comprises an upper surface having a first curve that meets a second curve at a peak arranged below the top surface of the metal interconnect layer, wherein the first curve becomes steeper as a distance from the peak decreases and wherein the second curve becomes steeper as a distance from the peak decreases.

* * * * *